United States Patent [19]

Schierz

[11] 4,047,197
[45] Sept. 6, 1977

[54] HOUSING AND LEAD STRUCTURE FOR A SERIES CONNECTED SEMICONDUCTOR RECTIFIER ARRANGEMENT

[75] Inventor: Winfried Schierz, Roth, Germany

[73] Assignee: SEMIKRON Gesellschaft fur Gleichrichterbau und Elektronik m.b.H., Nurnburg, Germany

[21] Appl. No.: 677,851

[22] Filed: Apr. 16, 1976

[30] Foreign Application Priority Data

Apr. 19, 1975  Germany .................. 7512573[U]

[51] Int. Cl.² .............. H01L 23/02; H01L 23/28; H01L 23/16; H01L 39/02
[52] U.S. Cl. .................. 357/81; 357/72; 357/75; 357/80
[58] Field of Search ............ 357/72, 74, 75, 76, 357/79, 80, 81

[56] References Cited

U.S. PATENT DOCUMENTS

| | | | |
|---|---|---|---|
| 3,483,444 | 12/1969 | Parrish | 357/75 |
| 3,519,888 | 7/1970 | Parrish | 357/75 |
| 3,644,797 | 2/1972 | Carter | 357/75 |
| 3,648,121 | 3/1972 | Suenaga et al. | 357/75 |
| 3,784,725 | 1/1974 | Perkins et al. | 357/75 |

FOREIGN PATENT DOCUMENTS 1,049,981  11/1966  United Kingdom .......... 357/75

Primary Examiner—Andrew J. James
Attorney, Agent, or Firm—Spencer & Kaye

[57] ABSTRACT

A semiconductor rectifier arrangement in which two semiconductor rectifier devices which each have at least one pn junction are fastened with their connecting components to one side of a common metallic base plate in an electrically isolated but thermally conducting manner, are connected into an electrical series circuit to form a structural unit and are disposed in a housing. In addition to the two current conducting terminals associated with the input and output of the series circuit, a third current conducting terminal is provided which is connected with the conductor connecting the two semiconductor rectifier wafers in series. The three current conducting terminals are arranged in a row with the third terminal associated with the connecting conductor preferably being disposed at one end of the row. Each one of the two outer current conducting terminals and its associated semiconductor rectifier device is fastened and electrically conductively connected to a respective one of a pair of contacting layers which are spaced from one another and are permanently affixed to the base plate via an intermediate disc of electrical insulating material.

19 Claims, 3 Drawing Figures

HOUSING AND LEAD STRUCTURE FOR A SERIES CONNECTED SEMICONDUCTOR RECTIFIER ARRANGEMENT

BACKGROUND OF THE INVENTION

The present invention relates to a semiconductor rectifier arrangement in which two semiconductor rectifier devices or wafers, which each have at least one pn junction, are fastened with their connecting parts to one side of a common metallic base plate in electrical isolation to be thermally conductive, are combined in electrical series connection to form a structural unit and are disposed in a housing.

Semiconductor rectifier arrangements in various rectifier circuit configurations are used to an increasing degree in control and regulating circuits, for example, for the speed regulation of electric motors. However, the use of known embodiments of semiconductor rectifier elements or rectifier arrangements is often encumbered with drawbacks. For example, when the known rectifier arrangements are used in three-phase networks, the arrangement of a row of several devices with mutual electrical connections involves undesirable space requirements and high expenditures for connecting components. Additionally, the multitude of applications with different requirements as regards installation and space utilization require different structural shapes and sizes. Finally, the known rectifier arrangements do not always meet the existing requirements for economical fabrication with respect to their particular structure.

SUMMARY OF THE INVENTION

It is the object of the present invention to provide semiconductor rectifier arrangements which have a more economical structure than the known embodiments and, with their more favorable design and advantageous arrangement of connecting components permit particularly advantageous assembly of such modules into various rectifier circuits.

The above object is achieved in a semiconductor rectifier arrangement of the above-mentioned type in that in addition to the two current conducting terminals associated with the input and output of the series connection of two semiconductor rectifier wafers, a third current connecting terminal is provided which is associated with the conductor connected between the two semiconductor rectifier wafers to connect same in series; the three current conducting terminals are disposed in a row with the third terminal, which is associated with the conductor connected between the two rectifier wafers, preferably being disposed at one end of the row; and each one of the two outer current conducting terminals and its associated semiconductor rectifier device are fastened and conductively connected to a respective one of a pair of contacting layers which are spaced from one another and are permanently connected to the base plate via an intermediate disc of electrical insulating material.

DETAILED DESCRIPTION OF THE PREFERRED EMBODIMENTS

Figure 1:
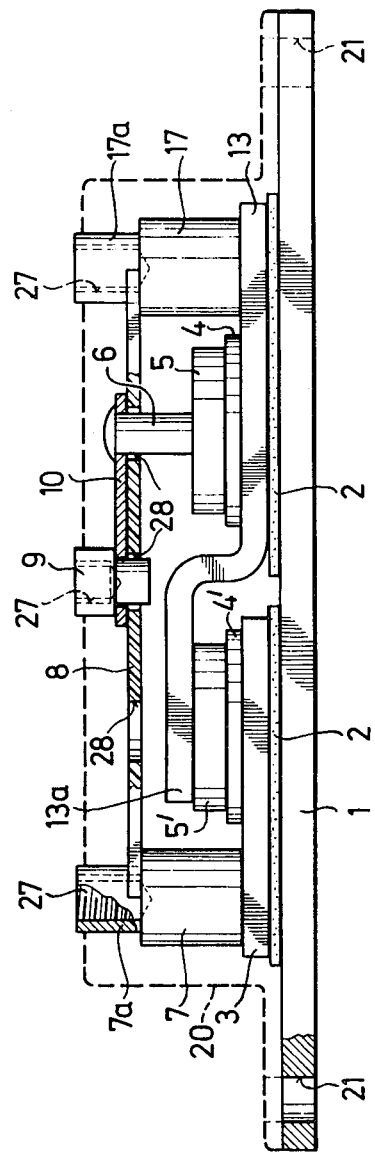
FIG. 1 is a side view, and partially in cross section, of a structure of semiconductor rectifier elements with one pn junction, i.e., with only two connecting electrodes, according to the invention.

Referring now to figures, wherein the same reference numerals are used in all figures for like parts, in the structure shown in FIG. 1 the numeral 1 identifies a thermally and electrically well conducting, planar, bar-shaped base plate, made, for example, of copper. The base plate 1 is provided at each of its two end sections of its, for example, rectangular areal expanse, with at least one fastening bore 21.

The thickness of base plate 1 is not critical. It is intended to assure mechanical stability of the arrangement according to the present invention in all cases of application and contribute to a favorable thermal operating behavior. The length is substantially determined by the space requirement for the two semiconductor rectifier elements or devices and for one connecting element for each. The width of the base plate 1 depends on the areal expanse of the semiconductor rectifier devices and upon the arrangement and expanse of the circuit components fastened to base plate 1.

In order to electrically insulate each semiconductor rectifier device or wafer from the base plate 1, electrically insulating and thermally well conducting planar intermediate discs 2, which are as thin as possible, are provided on base plate 1 and are made, for example, of an oxide ceramic. These intermediate discs 2 are fastened to the base plate 1 at small mutual spacings, for example, by soldering. In order to be so connected and to be connected with further components on their free surface side by means of soldering, the individual discs 2 are provided with appropriate metallizations, i.e., thin layers of metal. Alternatively the discs 2 may be provided in the form of a single continuous intermediate disc or layer on whose surface appropriate metallizations are applied at mutual spacings. Moreover, instead of by soldering, if desired the intermediate discs 2 may be fastened to the base plate 1 by an adhesive, e.g. an epoxy resin.

To provide good electrical and thermal contact for the semiconductor elements, a respective planar contacting layer or disc 3 or 13 of a thermally and electrically well conducting material, for example, copper, is fastened on each intermediate disc 2 preferably by soldering and is surface treated for this purpose, if required. In such case, the upper surface of the discs 2 must of course be provided with suitable metallizations as discussed above. It is to be understood however that, if desired, the contacting discs 3 and 13 may be fastened to the intermediate discs 2 by means of an adhesive. The areal expanse of each of the contacting discs 3, 13 is less than that of the intermediate insulating discs 2 in order to assure electrical insulation of the semiconductor rectifier devices from the base plate 1, and this expanse is determined by the space requirements for the respective semiconductor wafer and for the current conducting terminal for the connecting contact or electrode of the semiconductor wafer which faces the base plate 1. The discs 2 and contacting discs 3, 13 may have any desired areal shape.

Fastened in an electrically conductive manner to the upper surface of each of the contacting discs 3 and 13 is a conventional unencapsulated semiconductor rectifier wafer 4 or 4' respectively, each of which includes at least one rectifying or pn junction, and, as is conventional, is provided with connecting contacts on each of its opposite major surfaces. It is to be understood, however, that if desired, metal encapsulated semiconductor elements or devices may be used.

The upper contacting surface of each of the semiconductor rectifiers 4 and 4' is conductively connected to a metal contacting plate 5 and 5' respectively. The connecting plate 5 or 5' of one of the semiconductor wafers 4 or 4', in the illustrated embodiment the contacting plate 5 of the wafer 4, is permanently connected with a connecting conductor 6, which may have the form of a bolt, a pin or a strip, which leads to one of the current conducting terminals of the total arrangement. In order to connect the two semiconductor rectifier wafers 4 and 4' in series, the connecting plate 5', and hence the upper connecting contact of the semiconductor wafer 4', is connected to one of the connecting contacts of the wafer 4. In the illustrated embodiment wherein the semiconductor rectifier wafers have the same polarity orientation with respect to the base plate 1, this is accomplished by connecting the connecting plate 5' to the contacting disc 13. Preferably this is accomplished, as shown in FIG. 1, by providing the contacting disc 13 with a bar-shaped extension whose end section 13a is crimped so that it extends parallel to the plane of the disc 13 in a direction toward the semiconductor rectifier wafer 4' and at such a height that it can be fastened directly or via a conductor in a planar manner to the upper connecting contact of the adjacent semiconductor wafer 4'. The extension of the contacting disc 13 may be given a special shape to compensate for thermal expansions which occur during use.

In order to complete the series circuit arrangement, input and output current conducting terminals, e.g., the terminals 7 and 9, are connected to the ends of the series connection of the wafers 4 and 4'. Moreover, in addition to the current conducting terminals at the input and output of the series connection, a further current conducting terminal, e.g. the terminal 17, is provided and connected to the conductor connected between the two semiconductor rectifier wafers, i.e. the contacting disc 13 and its extension in the illustration of FIG. 1. In this way, the semiconductor rectifier elements or wafers 4 and 4' can be used individually or, with the suitable connections of the current conducting terminals, in series connection, in antiparallel connection or in doubling connections.

According to the preferred embodiment of the invention, the semiconductor wafers 4 and 4' are fastened to the contacting discs 13 and 3 respectively with their positive electrodes and the current conducting terminals associated to the circuit input and to the connecting conductor are each provided in the form of a connecting stud or bolt 7 or 17 respectively, which together with the corresponding semiconductor wafer 4' or 4 are each fastened to associated contacting disc 3 or 13, respectively. The current conducting terminal 9 associated to the circuit output is attached to the conductor 6 in the space between the two connecting studs 7, 17 which are disposed, for example, perpendicular to the surface of their associated contacting discs 3 and 13 respectively. All of the current conducting terminals 7, 9 and 17 are disposed in a row, for example, in a straight line extending along the longitudinal axis of the base plate 1. Preferably, both outer terminals 7, 17 are equidistantly spaced from the center terminal 9.

The thickness of the connecting bolts or studs 7 and 17 depends on the current density determined by the active surface of the intended semiconductor wafers, and their length depends on the height of the semiconductor rectifier arrangement structure and on structural considerations for fastening current conducting parts.

As shown in FIG. 1, preferably the frontal or end surface of the free end of each of the terminals 7, 9 and 17 is provided with a blind bore 27 with internal threads to permit a screw connection to external current conducting members.

The spatial arrangement of the current conducting terminals 7, 9 and 17 in a row, particularly with the current conducting terminal associated with the conductor connected between the two wafers, i.e., the terminal 17, being disposed at one end of the row of terminals, results in the significant advantage that it is possible to realize, in an economical manner, different rectifier circuit arrangements with the aid of one or a plurality of contacting bars between the terminals of one or more semiconductor arrangements.

In the arrangement according to the invention, in order to mount and properly space the center current conducting terminal 9, a bar-shaped member 8 of insulating material is provided. In the embodiment illustrated in FIG. 1 the member is provided at each of its frontal or end surfaces with a recess 8a (see FIG. 2) which is open toward the end surface and whose size is adapted to the circumference of the terminal studs 7 and 17. With the aid of this configuration the member 8 is disposed in a plane parallel manner with respect to the base plate 1 between the terminal studs 7 and 17 and is guided thereby. The member 8 is supported at each end by an external shoulder or step-shaped section of each stud 7, 17 caused by forming the free end of each of the studs 7 and 17 as a section 7a and 17a respectively having a smaller cross section.

The insulating member 8 which consists, for example, of woven glass fibers, is provided with a plurality of openings 28 along its extent between the current conducting terminal studs 7 and 17. One of these openings 28 serves as a passage for the conductor 6 connected to the upper connecting contact of the semiconductor rectifier wafer 4 and another opening 28 serves to receive and support the third current conducting terminal 9. As shown in FIG. 1, terminal 9 is centrally disposed with respect to the terminals 7 and 17 and hence is offset with respect to the connecting conductor 6. Accordingly, terminal 9 is permanently fastened in a conductive manner to the conductor 6 via a contacting bar 10 which extends along the surface of the member 8.

According to a modification of the present invention, with the appropriate longitudinal expanse of the semiconductor arrangement, the conductor 6 for the semiconductor rectifier wafer 4 may itself be provided with a sufficient length so that it extends through an opening 28 in the insulating member 8 and beyond the latter, and is designed at its free end as a current conducting terminal. If necessary, a mechanical connection of the conductor 6 to the insulating member 8 may be effected with the aid of known components, e.g. by screwing.

As shown, the current conducting terminal 9 may be a cylindrical component, which is preferably designed at its upper end to coincide with the upper or free ends of the terminal studs 7 and 17, and at its lower end to have a smaller cross section so that it can be pushed through the opening 28 provided in the bar-shaped insulating member 8 and through an opening provided in the contacting bar 10. The contacting bar 10 is a stamped part, for example, and is surface treated, if required, to provide for solder connections to the conductor 6 and the terminal 9.

The above-described structure of an embodiment of the present invention is accommodated in a plastic housing 20, as shown in dashed lines in FIG. 1. The housing 20 is fastened to the base plate 1, for example, by means of an adhesive or by riveting to its passages 21. The plastic housing 20 may comprise a wall portion and a cover portion or may be a one-piece component and, as shown in FIG. 1, is connected with the base plate 1 at a flange-shaped extension. Since the plastic housing does not contribute to the distinguishing features of the present invention, it will not be discussed further.

Within the plastic housing 20 the structure comprising semiconductor wafers 4 and 4' and contacting components is embedded in a cast mass to a height above the insulating member 8. Thus the required mechanically strong arrangement of terminal 9 is assured during installation of the semiconductor rectifier arrangement. Instead of embedding the arrangement in a cast mass in a plastic housing, the intended structure may also be enclosed in a pressed plastic mass of suitable shape.

According to a further embodiment of the present invention, a structure without the insulating member 8 is utilized wherein the upper free ends of the terminal studs 7 and 17 and the upper connecting conductor 6 are all designed as current conducting terminals and the three current conducting terminals, after initially being positioned with the aid of a reference gauge, are permanently embedded in a plastic cast mass in the desired mutual association.

Figure 2:
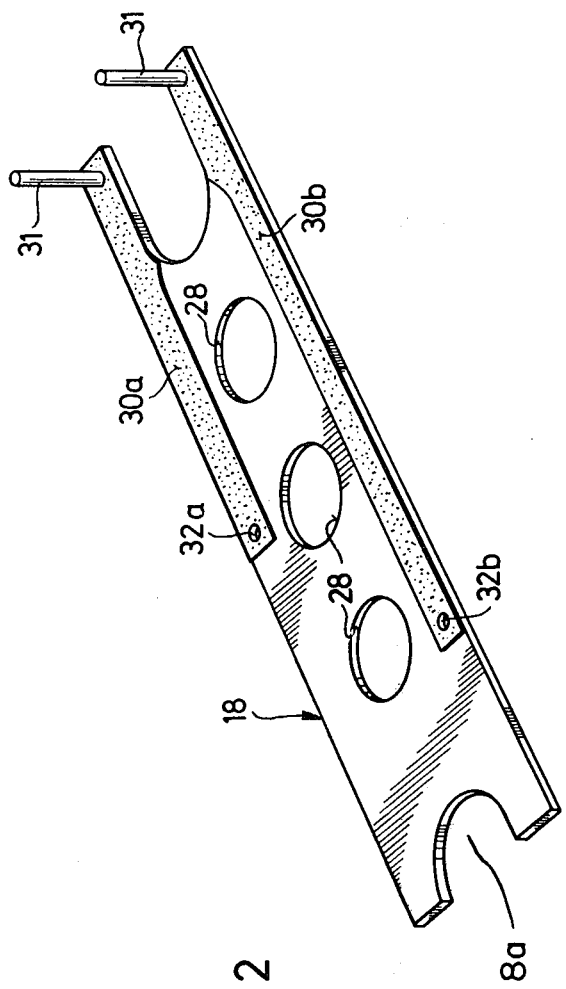
FIG. 2 is a perspective view of an insulating member for the arrangement of the connecting conductors, but for a structure comprising semiconductor rectifier elements having three connecting electrodes.

When the semiconductor rectifier wafers 4 and 4' contain controllable semiconductor rectifiers, i.e., thyristors, the preferably wire-shaped control electrodes of the thyristor wafers are brought to the bar-shaped insulating member 8 at suitable points and are connected thereto by soldering. FIG. 2 shows an insulating member 18 which is simply the member 8 of FIG. 1 modified for use with controlled rectifiers. As shown, the bar-shaped member 18 is provided on its upper surface with conductor paths 30a, 30b, which extend along the longitudinal edge zones. The conductor paths 30a and 30b are each provided at one end with a passage 32a or 32b respectively, for connection to the associated control electrode, and at the other end with a respective bolt-shaped control current terminal 31. The control current terminals 31 may simply be attached to the member 18 and directly connected with the respective control electrodes so that conductive paths 30a, 30b are not necessary.

The width of the insulating member 8 or 18 depends on the width of the base plate 1. The further unused opening 28 is provided in the members 8 and 18 to aid in the filling of the plastic housing with the cast mass.

In order to produce rectifier arrangements according to the invention, one continuous or two intermediate discs 2 are initially fastened to base plate 1. Then a stack of elements including components 13, 4, 5 and 6 or 3, 4', 5' and 13a, is placed on each one of the two metallization, with foils of soldering metal therebetween and additionally the associated connecting stud 7 or 17, respectively, is attached and this structure is subjected to a heat treatment to produce the respective solder connections. Once the insulating member 8, 18, with the parts to be contacted are arranged between connecting studs 7, 17, the current conducting terminal 9 is connected with terminal 6 via contacting bar 10.

Thereafter the plastic housing is applied and is permanently connected with base plate 1, for example, by means of an adhesive. Finally the plastic housing is filled with a cast mass in which the structure in the interior of the housing is embedded to a height above the insulating member 8.

Figure 3:
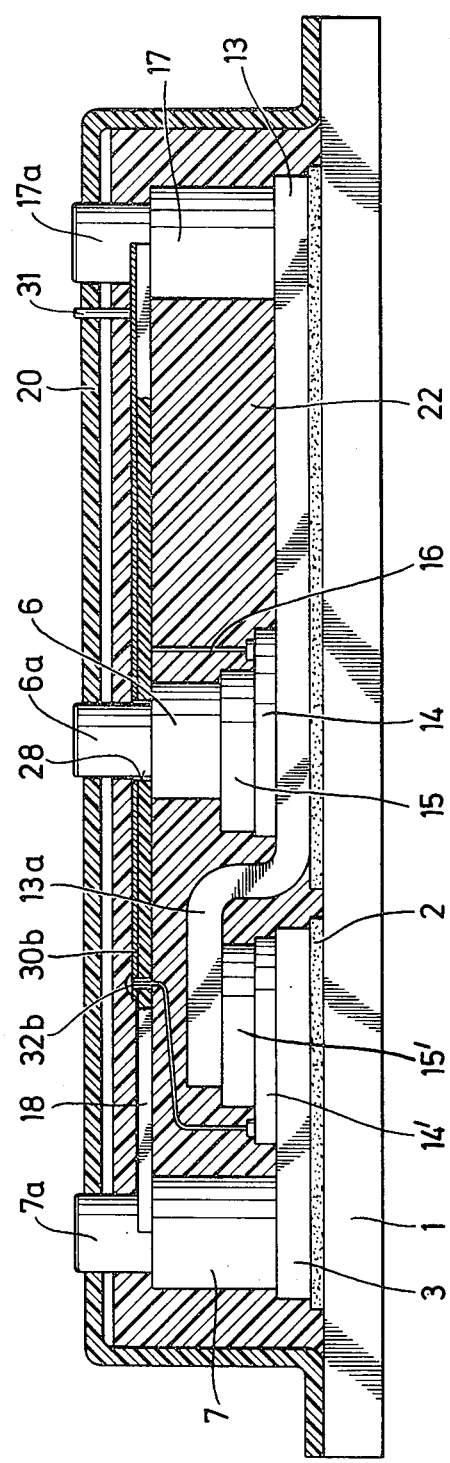
FIG. 3 is a side view partially in cross section, of a structural arrangement of controllable semiconductor rectifier elements according to the invention, wherein all structure parts are arranged in a housing of insulating material and they are embedded in a cast or pressed mass of insulating material within the housing.

FIG. 3 shows a structure, substantially as shown in FIG. 1, but including controllable semiconductor elements 14 and 14' each having a control electrode 16 or 16' respectively and each having its upper contacting surface being fastened to a connecting plate 15 or 15' respectively. The bar-shaped member 18 is provided with at least one opening 28 in which the center current conducting terminal 6 with its extension 6a is arranged. As shown, the terminal 6 is at the same time, directly over and connected to the plate 15 of the upper connecting contact of the semiconductor rectifier wafer 14.

The control electrode of each of the rectifier wafers, e.g., the rectifier wafer 14', is passed through the associated passage in the member 18, e.g., the passage 32b and is connected to the associated conductor path, e.g., the path 30b, by soldering. All the structural parts are arranged in a housing 20 of insulating material and within this housing the parts up to the bar-shaped member 18 are embedded in a cast or pressed mass 22 of insulating material e.g. epoxy resin. The housing 20 may also be of a suitable resin.

It will be understood that the above description of the present invention is susceptible to various modifications, changes and adaptations, and the same are intended to be comprehended within the meaning and range of equivalents of the appended claims.

What is claimed is:

1. A semiconductor rectifier arrangement comprising in combination:
   a metal base plate;
   a layer of electrically insulating but thermally conductive material fastened to the upper surface of said base plate;
   a pair of electrical contact layers fastened to the surface of said layer of insulating material and electrically isolated from one another;
   a pair of semiconductor rectifier devices, each having at least one pn junction and a connecting contact on each of its two opposite major surfaces, each of said semiconductor devices being mounted on and having one of its said connecting contacts electrically connected to a respective one of said electrical contact layers;
   conductive means for electrically connecting one connecting contact on one of said semiconductor rectifier devices to one connecting contact on the other of said semiconductor rectifier devices to connect said semiconductor devices in a series circuit;
   first, second and third current conducting terminals connected to the input of said series circuit, to the output of said series circuit, and to said conductive means, respectively, said first, second and third current conducting terminals being arranged in a row with each of the two outer current conducting terminals of said row being electrically conductively connected to one of said electrical contact layers; and a plastic housing connected to said base plate and in which said series circuit, including its connecting parts is disposed.

2. A semiconductor rectifier arrangement as defined in claim 1 wherein one of said two outer current conducting terminals is said third current conducting terminal, and wherein each of said semiconductor rectifier wafers has the same polarity orientation relative to said base plate.

3. A semiconductor rectifier arrangement as defined in claim 2 wherein said semiconductor rectifier devices are unencapsulated disc-shaped wafers.

4. A semiconductor rectifier arrangement as defined in claim 2 wherein said semiconductor devices are metal encapsulated wafers.

5. A semiconductor rectifier arrangement as defined in claim 2 wherein said layer of insulating material includes a separate disc of oxide ceramic for each of said semiconductor rectifier devices.

6. A semiconductor rectifier arrangement as defined in claim 2 wherein said layer of insulating material is a disc of oxide ceramic.

7. A semiconductor rectifier arrangement as defined in claim 2 wherein said layer of insulating material is permanently fastened to said base plate by means of an adhesive.

8. A semiconductor rectifier arrangement as defined in claim 2 wherein said layer of insulating material is provided with metallizations on its opposed surfaces and permanently is connected with said contacting layers and with said base plate by means of soldering.

9. A semiconductor rectifier arrangement as defined in claim 2 wherein each of said contacting layers is of a metallic contacting disc.

10. A semiconductor rectifier arrangement as defined in claim 9 wherein each of said metallic contacting discs is fastened to said layer of insulating material by means of an adhesive.

11. A semiconductor rectifier arrangement as defined in claim 8 wherein said conductive means for electrically connecting said rectifier devices in a series circuit includes a bar-shaped extension for one of said metallic contacting discs, said bar-shaped extension having an end section which is permanently connected with the upper connecting contact of the semiconductor rectifier device associated with the other of said metallic contacting discs.

12. A semiconductor rectifier arrangement as defined in claim 8 wherein the two outer current conducting terminals are provided in the shape of studs and are fastened to their respective contacting discs in a vertical arrangement.

13. A semiconductor rectifier arrangement as defined in claim 12 wherein said stud-shaped current conducting terminals are provided at their free ends with screw threads suitable for a screw connection with external conductor parts.

14. A semiconductor rectifier arrangement as defined in claim 12 wherein: each of said stud-shaped current conducting terminals is provided with an external shoulder; a bar-shaped member of insulating material having suitable openings adjacent its respective end surfaces extends between said outer current conducting terminals and is supported on said shoulders; the center one of said current conducting terminals is disposed on said bar-shaped member; and means are provided for conductively connecting said center current conducting terminal to the upper connecting contact of the associated one of said semiconductor rectifier devices.

15. A semiconductor rectifier arrangement as defined in claim 14 wherein said bar-shaped member is provided with at least one opening in which said center current conducting terminal is fastened.

16. A semiconductor arrangement as defined in claim 15 wherein: said center current conducting terminal is laterally offset with respect to its said associated semiconductor rectifier device; said bar-shaped member has at least one further opening vertically disposed above said semiconductor rectifier device associated with said center current conducting terminal; and said means for conductively connecting said center current conducting terminal includes a bar-shaped conductor connected to said center current conducting terminal and extending therefrom along the surface of said bar-shaped member to said further opening, and a vertically extending conductive pin having one end connected to said upper connecting contact of said one of said semiconductor rectifier devices associated with said center current conducting terminal and its other end connected to said bar-shaped conductor.

17. A semiconductor rectifier arrangement as defined in claim 14 wherein the components within said housing, including said semiconductor rectifier devices and their connecting parts up to said bar-shaped member of insulating material are embedded in a cast or pressed mass of insulating material.

18. A semiconductor arrangement as defined in claim 14 wherein: said semiconductor rectifier elements are controlled rectifiers each additionally having a control electrode on its upper major surface; and said bar-shaped member is provided with a pair of conductive paths on the surface thereof, each said conductive path being provided with respective openings for attaching the conductive paths to the associated control electrode and to an associated control current terminal.

19. A semiconductor rectifier arrangement as defined in claim 2 wherein the center one of said current conducting terminals directly constitutes a portion of the upper connecting contact of the associated said semiconductor rectifier device.

* * * * *

REEXAMINATION CERTIFICATE (321st)

United States Patent [19]
Schierz

[11] B1 4,047,197
[45] Certificate Issued  Mar. 26, 1985

[54] HOUSING AND LEAD STRUCTURE FOR A SERIES CONNECTED SEMICONDUCTOR RECTIFIER ARRANGEMENT

[75] Inventor: Winfried Schierz, Roth, Fed. Rep. of Germany

[73] Assignee: SEMIKRON Gesellschaft fur Gleichrichterbau und Elektronik m.b.H., Nurnburg, Fed. Rep. of Germany

Reexamination Request:
No. 90/000,561, May 21, 1984

Reexamination Certificate for:
Patent No.: 4,047,197
Issued: Sep. 6, 1977
Appl. No.: 677,851
Filed: Apr. 16, 1976

[30] Foreign Application Priority Data
Apr. 19, 1975 [DE]  Fed. Rep. of Germany ... 7512573[U]

[51] Int. Cl.³ .................. H01L 23/02; H01L 23/28; H01L 39/02; H01L 23/16
[52] U.S. Cl. ...................... 357/81; 357/72; 357/75; 357/80
[58] Field of Search ............ 357/74, 75, 76, 80, 357/81

[56] References Cited

U.S. PATENT DOCUMENTS

| | | | |
|---|---|---|---|
| 2,745,044 | 5/1956 | Lingel | |
| 3,463,970 | 8/1969 | Gutzwiller | |
| 3,483,444 | 12/1969 | Parrish | 357/75 |
| 3,519,888 | 7/1970 | Parrish | 357/75 |
| 3,644,797 | 2/1972 | Carter | 357/75 |
| 3,648,121 | 3/1972 | Suenaga et al. | 357/76 |
| 3,783,347 | 1/1974 | Vladik | 357/81 |
| 3,784,725 | 1/1974 | Perkins et al. | 357/74 |
| 3,900,770 | 8/1975 | Kaufman | 307/252 L |
| 3,958,075 | 5/1976 | Kaufman | 357/80 |

FOREIGN PATENT DOCUMENTS

| | | | |
|---|---|---|---|
| 1226215 | 10/1966 | Fed. Rep. of Germany | |
| 2337694 | 11/1974 | Fed. Rep. of Germany | 357/82 |
| 1170225 | 1/1959 | France | |
| 1049981 | 11/1966 | United Kingdom | 357/75 |

OTHER PUBLICATIONS

Unitrode Corp. Data Sheet T-167, "High Current Magnum 1M Series ... Rectifiers," (Unitrode, Watertown, Mass., Jul. 1969).
International Rectifier, Data Sheet No. PD-4.017, Dec. 1972, (International Rectifier, El Segundo, CA).
International Rectifier, Rectifier News, Issue No. 1, 1971.
Semtech Bulletin, MB44, Jun. 1967.
AEI Semiconductors, Plastic Power Circuit, Jun. 1970.
AEI Semiconductors, Power Microcircuit PM7A, May 1970.

*Primary Examiner*—William D. Larkins

[57] ABSTRACT

A semiconductor rectifier arrangement in which two semiconductor rectifier devices which each have at least one pn junction are fastened with their connecting components to one side of a common metallic base plate in an electrically isolated but thermally conducting manner, are connected into an electrical series circuit to form a structural unit and are disposed in a housing. In addition to the two current conducting terminals associated with the input and output of the series circuit, a third current conducting terminal is provided which is connected with the conductor connecting the two semiconductor rectifier wafers in series. The three current conducting terminals are arranged in a row with the third terminal associated with the connecting conductor preferably being disposed at one end of the row. Each one of the two outer current conducting terminals and its associated semiconductor rectifier device is fastened and electrically conductively connected to a respective one of a pair of contacting layers which are spaced from one another and are permanently affixed to the base plate via an intermediate disc of electrical insulating material.

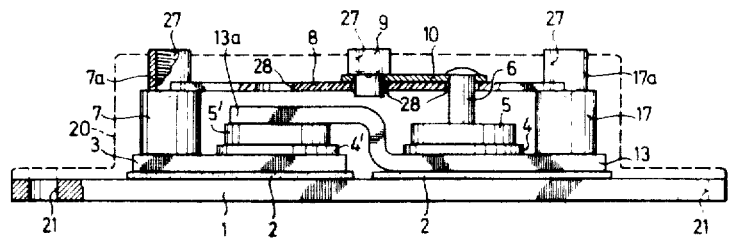

REEXAMINATION CERTIFICATE ISSUED UNDER 35 U.S.C. 307

THE PATENT IS HEREBY AMENDED AS INDICATED BELOW.

Matter enclosed in heavy brackets [] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 2 are determined to be patentable as amended.

Claims 3-19, dependent on an amended claim, are determined to be patentable.

1. A semiconductor rectifier arrangement comprising in combination:
   a metal base plate;
   a layer of electrically insulating but thermally conductive material fastened to the upper surface of said base plate;
   a pair of electrical contact layers fastened to the surface of said layer of insulating material and electrically isolated from one another;
   a pair of semiconductor rectifier devices, each having at least one pn junction and a connecting contact on each of its two opposite major surfaces, each of said semiconductor devices being mounted on and having one of its said connecting contacts electrically connected to a respective one of said electrical contact layers;
   conductive means for electrically connecting one connecting contact on one of said semiconductor rectifier devices to one connecting contact on the other of said semiconductor rectifier devices to connect said semiconductor devices in a series circuit;
   first, second and third current conducting terminals connected to the input of said series circuit, to the output of said series circuit, and to said conductive means, respectively, said first, second and third current conducting terminals being arranged in a row with each of the two outer current conducting terminals of said row being electrically conductively connected to one of said electrical contact layers *with one of said two outer current conducting terminals being said third current conducting terminal;* and
   a plastic housing connected to said base plate and in which said series circuit, including its connecting parts is disposed.

2. A semiconductor rectifier arrangement [as defined in claim 1] *comprising in combination:*
   *a metal base plate;*
   *a layer of electrically insulating but thermally conductive material fastened to the upper surface of said base plate;*
   *a pair of electrical contact layers fastened to the surface of said layer of insulating material and electrically isolated from one another;*
   *a pair of semiconductor rectifier devices, each having at least one pn junction and a connecting contact on each of its two opposite major surfaces, each of said semiconductor devices being mounted on and having one of its said connecting contacts electrically connected to a respective one of said electrical contact layers;*
   *conductive means for electrically connecting one connecting contact on one of said semiconductor rectifier devices to one connecting contact on the other of said semiconductor rectifier devices to connect said semiconductor devices in a series circuit;*
   *first, second and third current conducting terminals connected to the input of said series circuit, to the output of said series circuit, and to said conductive means, respectively, said first, second and third current conducting terminals being arranged in a row* with each of the two outer current conducting terminals of said row being electrically conductively connected to one of said electrical contact layers; and
   *a plastic housing connected to said base plate and in which said series circuit, including its connecting parts is disposed,*
   wherein one of said two outer current conducting terminals is said third current conducting terminal, and wherein each of said semiconductor rectifier devices [wafers] has the same polarity orientation relative to said base plate.

* * * * *